(12) United States Patent
Stadel et al.

(10) Patent No.: US 8,067,315 B2
(45) Date of Patent: Nov. 29, 2011

(54) MICROSTRUCTURE DEVICE INCLUDING A COMPRESSIVELY STRESSED LOW-K MATERIAL LAYER

(75) Inventors: Marcus Stadel, Dresden (DE); Sven Auerswald, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 219 days.

(21) Appl. No.: 12/396,065

(22) Filed: Mar. 2, 2009

(65) Prior Publication Data

US 2009/0294810 A1 Dec. 3, 2009

(30) Foreign Application Priority Data

May 30, 2008 (DE) .......................... 10 2008 026 182

(51) Int. Cl.
*H01L 21/31* (2006.01)
*H01L 21/469* (2006.01)
(52) U.S. Cl. ............ 438/778; 257/E21.24; 257/E29.255
(58) Field of Classification Search .................. 438/778; 257/E21.24, E29.255
See application file for complete search history.

(56) References Cited

U.S. PATENT DOCUMENTS

2007/0296027 A1* 12/2007 Yang et al. .................... 257/327

FOREIGN PATENT DOCUMENTS

WO  WO 2007/149788 A2  12/2007

OTHER PUBLICATIONS

Translation of Official Communication from German Patent Office for German Patent Application No. 10 2008 026 182.3-33 dated Jul. 26, 2009.

* cited by examiner

*Primary Examiner* — David S Blum
(74) *Attorney, Agent, or Firm* — Williams, Morgan & Amerson, P.C.

(57) ABSTRACT

A nitrogen-containing silicon carbide material may be deposited on the basis of a single frequency or mixed frequency deposition recipe with a high internal compressive stress level up to 1.6 GPa or higher. Thus, this dielectric material may be advantageously used in the contact level of sophisticated integrated circuits, thereby providing high strain levels while not unduly contributing to signal propagation delay.

17 Claims, 5 Drawing Sheets

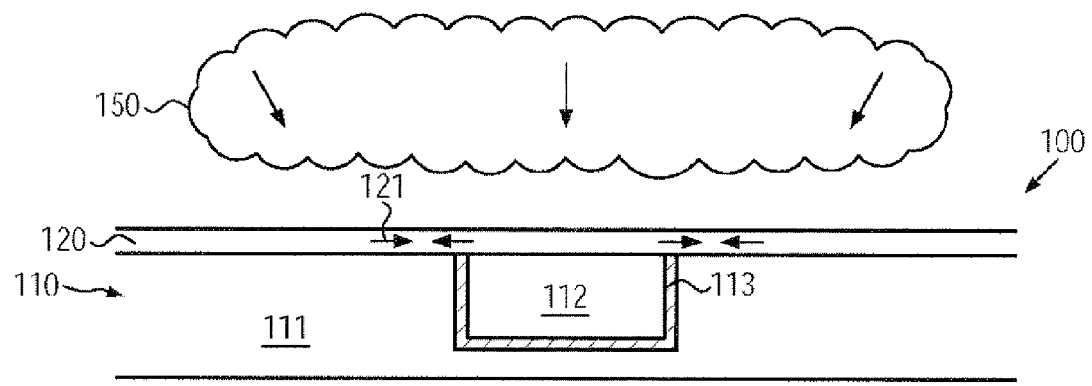
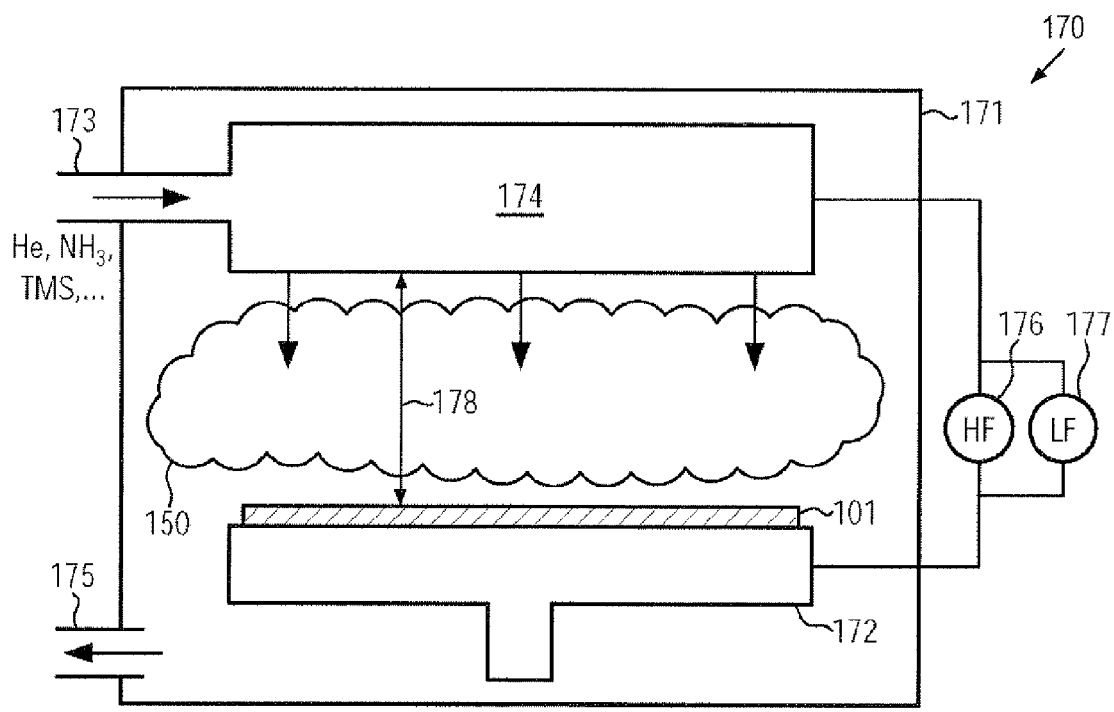
FIG. 1a
FIG. 1b

MICROSTRUCTURE DEVICE INCLUDING A COMPRESSIVELY STRESSED LOW-K MATERIAL LAYER

BACKGROUND

1. Field of the Disclosure

Generally, the present disclosure relates to the fabrication of microstructure devices, such as integrated circuits, and, more particularly, to the formation of dielectric layers of reduced permittivity having etch stop capabilities.

2. Description of the Related Art

Semiconductor devices are typically formed on substantially disc-shaped substrates made of any appropriate material. The majority of semiconductor devices including highly complex electronic circuits are currently, and in the foreseeable future will be, manufactured on the basis of silicon, thereby rendering silicon substrates and silicon-containing substrates, such as silicon-on-insulator (SOI) substrates, viable carriers for forming semiconductor devices, such as microprocessors, SRAMs, ASICs (application specific ICs) and the like. The individual integrated circuits are arranged in an array form, wherein most of the manufacturing steps, which may involve several hundred individual process steps in sophisticated integrated circuits, are performed simultaneously for all chip areas on the substrate, except for photolithography processes, metrology processes and packaging of the individual devices after dicing the substrate. Thus, economical constraints drive semiconductor manufacturers to steadily increase the substrate dimensions, thereby also increasing the area available for producing actual semiconductor devices and thus increasing production yield. On the other hand, device dimensions are continuously reduced in view of performance criteria, as, typically, reduced transistor dimensions provide increased operating speed.

In modern integrated circuits, the circuit elements are formed in and on a semiconductor layer, while most of the electrical connections are established in one or more "wiring" layers, also referred to as metallization layers, wherein the electrical characteristics, such as resistivity, electromigration, etc., of the metallization layers significantly affect the overall performance of the integrated circuit. Due to the ongoing demand for shrinking the feature sizes of highly sophisticated semiconductor devices, copper, in combination with a low-k dielectric material, has become a frequently used alternative in the formation of so-called wiring structures comprising metallization layers having metal line layers and intermediate via layers. Metal lines act as intra-layer connections and vias act as inter-layer connections, which commonly connect individual circuit elements to provide the required functionality of the integrated circuit. Typically, a plurality of metal line layers and via layers stacked on top of each other are necessary to realize the connections between all internal circuit elements and I/O (input/output), power and ground pads of the circuit design under consideration.

For extremely scaled integrated circuits, the signal propagation delay may no longer be limited by the circuit elements, for instance by field effect transistors, but may be limited, owing to the increased density of circuit elements, which requires an even more increased number of electrical connections, by the close proximity of the metal lines and vias, since the line-to-line capacitance increases as the spacing decreases. This fact, in combination with a restricted conductivity of the lines due to a reduced cross-sectional area, even though highly conductive metals may be used, results in increased resistance capacitance (RC) time constants. For this reason, traditional dielectrics such as silicon dioxide (k>4) and silicon nitride (k>7) are increasingly replaced in metallization layers by dielectric materials having a lower permittivity, which are therefore also referred to as low-k dielectrics having a relative permittivity of approximately 3 or significantly less. However, the density and mechanical stability or strength of the low-k materials may be significantly less compared to the well-approved dielectrics silicon dioxide and silicon nitride. Additionally, copper may readily diffuse in many low-k dielectrics, while also reactive components, such as oxygen, fluorine and the like, may come into contact with copper due to the limited diffusion blocking capabilities of the low-k dielectric materials.

For this reason, low-k dielectric materials may have to be used in combination with appropriate materials which may provide the desired copper-confining effect and may also be used as efficient etch stop materials during the patterning of the low-k dielectric materials. For example, silicon nitride may be used in combination with low-k dielectric materials, since silicon nitride may act as an efficient diffusion blocking material, for instance, with respect to copper and other reactive components, thereby maintaining integrity of a copper-based metal region. On the other hand, a plurality of plasma-assisted etch processes, as well as wet chemical etch processes, may be available in which silicon nitride exhibits a significantly reduced etch rate compared to other dielectric materials, such as silicon dioxide and a plurality of low-k dielectric materials. In sophisticated semiconductor devices, however, the overall permittivity of the metallization system may be affected by the provision of silicon nitride material, which may have a moderately high dielectric constant of approximately 6 or higher, which may therefore reduce performance gain obtained by the introduction of low-k dielectric materials. For this reason, great efforts have been made in order to develop material compositions that may provide the desired barrier capabilities, while also having a high etch resistance against a plurality of well-established plasma-assisted etch techniques for patterning low-k dielectric materials. One promising candidate in this respect is a nitrogen-containing silicon carbide layer which may be formed on the basis of plasma-assisted chemical vapor deposition (CVD) techniques on the basis of ammonia and trimethyl silane (TMS), which may have a dielectric constant of approximately 5, while at the same time providing the required diffusion blocking capabilities and etch stop qualities. Consequently, significant performance gain may be accomplished in the metallization level of sophisticated semiconductor devices.

The continuing shrinkage of transistor dimensions, however, also involves a plurality of issues at the transistor level that had to be addressed so as to not unduly offset the advantages obtained by steadily decreasing critical dimensions, such as the gate length of MOS transistors. The gate length, that may be highly correlated to the respective channel length, represents a dominant design criterion for enhancing performance of integrated circuits, since, in CMOS technology, transistor characteristics are substantially determined by the electrical behavior of a channel region, which separates drain and source regions and which is controlled on the basis of a gate electrode, which is separated from the channel region by a thin gate dielectric layer. One major problem in scaled transistor structures is to maintain channel controllability, which may be addressed by a plurality of design measures, many of which may be associated with a reduction of charge carrier mobility in the channel region, thereby reducing the overall gain in performance obtained by further reducing device dimensions. It has, therefore, been proposed to improve transistor performance by enhancing the channel conductivity of the transistor elements by increasing charge carrier mobility in the channel region for a given channel length. One efficient mechanism for increasing the charge carrier mobility is the modification of the lattice structure in the channel region, for instance by creating compressive stress in the vicinity of the channel region to produce a corresponding strain in the channel region, which may result in a modified mobility of holes. Thus, performance of P-channel transistors may be efficiently increased by introducing appropriate stress or strain engineering techniques into the fabrication process for sophisticated semiconductor devices. According to one promising approach for creating strain in the channel region of the transistor, the dielectric material that is formed above the basic transistor structure may be provided in a highly stressed state, for instance in a highly compressive state, in order to induce strain at the transistor and in particular in the channel region thereof. For example, the transistor structures are typically enclosed in an interlayer dielectric material, which may provide the desired mechanical and electrical integrity of the individual transistor structures and which may provide a platform for the formation of the additional wiring layers of the metallization system. The interlayer dielectric material may then be appropriately patterned to provide respective openings connected to the contact areas of the transistors, wherein the patterning process, which may represent one of the most critical processes, may be performed on the basis of an etch stop material in combination with the actual interlayer dielectric material.

For example, silicon dioxide is a well-established interlayer dielectric material in combination with silicon nitride, which may act as an efficient etch stop material during the formation of the contact openings. Consequently, the etch stop material, i.e., the silicon nitride material, is in close contact with the basic transistor structure and thus may be efficiently used for inducing strain in the transistors, in particular as silicon nitride may be deposited on the basis of well-established CVD techniques with high internal stress. For instance, silicon nitride may be deposited with high internal compressive stress of up to 2 GPa (Giga Pascal) or higher by selecting appropriate deposition parameters. On the other hand, a moderately high internal tensile stress level may be created up to 1 GPa and higher by appropriately adjusting the process parameters, such as pressure, temperature, gas flow rates and ion bombardment, during the deposition of the silicon nitride material. Consequently, in an attempt to increase the magnitude of strain created in the adjacent channel region, the internal stress level may be increased and the amount of stress material provided around the basic transistor structure may also be increased. It appears, however, that, in sophisticated applications, the dielectric characteristics of the silicon nitride material may reduce overall performance gain, since, in sophisticated device geometries, the stressed silicon nitride material may also be close to metal lines of the very first metallization layer as well as to the gate electrode structures and the contact elements, which may thus result in an increase of the parasitic capacitance, thereby contributing to significant signal propagation delays, as is previously described with reference to the metallization system. For this reason, the thickness of the highly stressed silicon nitride material may be reduced so as to find a compromise between a desired high strain level and an acceptable overall permittivity within the contact level of the semiconductor device under consideration, thereby, however, restricting the degree of performance gain that could be obtained by more fully exploiting the capabilities of stress liner approaches.

The present disclosure is directed to various methods and devices that may avoid, or at least reduce, the effects of one or more of the problems identified above.

SUMMARY OF THE DISCLOSURE

The following presents a simplified summary of the disclosure in order to provide a basic understanding of some aspects disclosed herein. This summary is not an exhaustive overview, and it is not intended to identify key or critical elements of the invention or to delineate the scope of the invention. Its sole purpose is to present some concepts in a simplified form as a prelude to the more detailed description that is discussed later.

Generally, the present disclosure relates to methods and semiconductor devices in which a dielectric material may be provided in a highly stressed compressive state while at the same time maintaining the dielectric constant at a moderately low level. For this purpose, a nitrogen, silicon and carbon-containing dielectric layer may be provided on the basis of appropriately selected process parameters so as to obtain an internal stress level of approximately 1 GPa or higher of compressive stress. Consequently, in some illustrative aspects disclosed herein, the corresponding dielectric material may be efficiently used in the contact level of sophisticated microstructure devices, since efficient strain engineering techniques may be used while not unduly contributing to signal propagation delays caused by a high dielectric constant in the contact level, as may be the case in conventional strategies, when high strain levels in the channel regions of P-channel transistors are to be achieved. The dielectric material having the high internal stress level may be formed on the basis of plasma-assisted CVD using precursor gases, such as ammonia, a silicon and carbon-containing gas in combination with helium as carrier gas. A moderately low deposition pressure may be established to obtain, in combination with appropriately selected AC power, respective plasma conditions in which the nitrogen-containing silicon carbide material may be deposited with high compressive stress. Thus, a high degree of compatibility with conventional device configurations and manufacturing schemes may be maintained since the nitrogen-containing silicon carbide material with high compressive stress may provide appropriate etch stop capabilities and barrier capabilities, thereby providing the possibility for "replacing" compressive silicon nitride materials by the low-k highly stressed dielectric material. Moreover, in some cases, a high compressive stress may be advantageous in the metallization level with respect to overall mechanical characteristics, electromigration behavior and the like, in which case the dielectric material having the high compressive internal stress level may be advantageously used without requiring significant modifications of the overall device configuration or manufacturing sequence.

One illustrative method disclosed herein comprises providing a substrate having formed thereon one or more material layers for defining one or more features of a microstructure device. The method further comprises establishing a gas ambient comprising helium (He), ammonia ($NH_3$) and a silicon and carbon-containing precursor gas at a pressure of approximately 1.8 Torr or less. Moreover, the method comprises creating a plasma in the gas ambient by supplying AC power at a power density of approximately 0.9-1.5 Watt/$cm^2$. Finally, the method comprises forming a dielectric layer above the one or more material layers, wherein the dielectric layer contains nitrogen, silicon and carbon.

A further illustrative method disclosed herein comprises forming a dielectric layer above a transistor structure wherein the dielectric layer comprises silicon, carbon and nitrogen and has an internal stress level of approximately 1 GPa or higher of compressive stress. The method additionally comprises forming a contact opening in the dielectric layer so as to connect to at least one of a drain region and a source region of the transistor structure.

One illustrative semiconductor device disclosed herein comprises a transistor comprising a gate electrode structure, drain and source regions and a channel region. Furthermore, the semiconductor device comprises a dielectric layer formed above the transistor wherein the dielectric layer comprises nitrogen, silicon and carbon and has a dielectric constant of approximately 5.0 or less and induces compressive strain in the channel region of the transistor.

BRIEF DESCRIPTION OF THE DRAWINGS

The disclosure may be understood by reference to the following description taken in conjunction with the accompanying drawings, in which like reference numerals identify like elements, and in which:

FIG. 1a schematically illustrates a cross-sectional view of a microstructure device, for instance in the form of an integrated circuit at a specific manufacturing stage, when a nitrogen-containing silicon carbide layer with high internal compressive stress is to be formed above device features in order to provide enhanced strain engineering techniques while not unduly contributing to overall permittivity, according to illustrative embodiments;

FIG. 1b schematically illustrates a process chamber for establishing an appropriate plasma ambient for depositing the nitrogen-containing silicon carbide material with high internal stress level and low dielectric constant, according to illustrative embodiments;

Figure 1C:
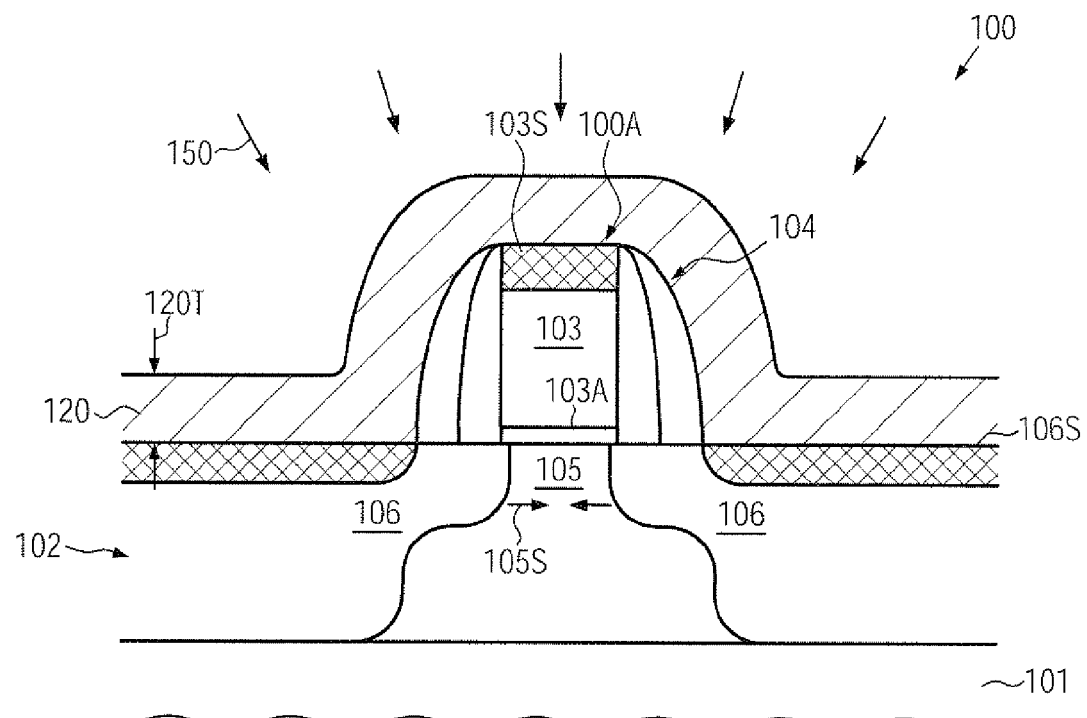
FIGS. 1c-1f schematically illustrate cross-sectional views of a transistor structure during various manufacturing stages in forming a highly stressed nitrogen-containing silicon carbide layer in the contact level of the device in order to maintain overall permittivity at a low level, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure addresses the problem of increased dielectric constants in dielectric materials used for applying a strain engineering technique by providing microstructures and methods in which a high internal compressive stress level may be obtained in a dielectric material, which may also exhibit desired etch stop and diffusion blocking capabilities while not unduly contributing to overall signal propagation delay. For this purpose, a nitrogen-containing silicon carbide material may be provided, which may have a low dielectric constant of approximately 5.0 or less, which may exhibit superior barrier and etch stop capabilities compared to other dielectric materials, such as silicon dioxide and the like, wherein, concurrently, a high compressive internal stress level may be provided, for instance, of 1 GPa or higher, thereby enabling efficient strain-inducing mechanisms, for instance, in the contact level of sophisticated integrated circuits. The high internal compressive strain level may be achieved by appropriately selecting process parameters during a plasma-assisted deposition process, such as the deposition pressure, the type of precursor gases and carrier gases and the power density established in the plasma ambient. In some illustrative embodiments, an appropriate plasma ambient may be established using helium as carrier gas and ammonia and a silicon and carbon-containing gas as precursor materials, wherein a single frequency AC power may be supplied, for instance in the range of 10-15 MHz, which may typically comprise an industrially used frequency range for establishing a plasma in a gaseous ambient. In this case, appropriate power density may be established without using a "low frequency" or bias power. In other illustrative embodiments, a reduced power density of the high frequency AC component may be used in combination with a bias or low frequency AC component, which may be several times higher compared to the high frequency component. In this context, a low frequency AC component is to be understood as electrical power supplied by an AC current, which may be inductively or capacitively coupled into the gas ambient and may have a frequency of approximately 1 MHz or lower, for instance several hundred KHz and the like.

Consequently, based on these single or double frequency recipes using appropriate further process parameters, as will be specified later on in more detail, a high degree of flexibility in using appropriate deposition tools may be provided. Based on the corresponding highly stressed dielectric material, performance of microstructure devices, such as integrated circuits, may be enhanced, compared to conventional strategies, by incorporating the highly stressed dielectric material into the metallization layer, if considered appropriate, for instance with respect to enhancing mechanical characteristics, electromigration behavior and the like, while, in other illustrative embodiments, the dielectric layer of reduced permittivity may be employed for a stress component in the contact level, for instance, in addition to or alternatively to silicon nitride material, thereby providing the possibility of creating higher internal strain levels while not unduly contributing to signal propagation delay.

FIG. 1a schematically illustrates a microstructure device 100 which, in some illustrative embodiments, may represent a semiconductor device, such as an integrated circuit, which may comprise digital and analog circuitry on the basis of CMOS technology, for instance in the form of microprocessors and the like. In other cases, the microstructure device 100 may represent any device in which microstructural features are to be provided, at least some of which may require an efficient strain engineering technique, while overall permittivity of dielectric materials may also have to be maintained at a low level, at least locally within the microstructure device 100. In the embodiment shown, the microstructure device 100 may comprise a substrate 101, which may represent a semiconductor material, an insulating material, or in general any appropriate carrier material in and above which respective features, such as circuit elements, metallization systems and the like, for advanced semiconductor devices or microstructure devices, may be provided. In the embodiment shown, it may be assumed that the substrate 101 may represent an appropriate carrier material having formed thereabove a semiconductor layer in and above which a plurality of circuit elements, such as transistors and the like (not shown), may be provided. In other cases, the substrate 101 may represent a carrier material above which a plurality of material layers 110 may be provided, which may represent features of the microstructure device 100. For example, the one or more layers 110 may represent a metallization level of a semiconductor device which may comprise a dielectric material 111, for instance in the form of a low-k dielectric material, as previously explained. Furthermore, the one or more material layers 110 may comprise a device feature 112, for instance in the form of a metal line, which may also comprise a conductive barrier material 113, if, for instance, sophisticated copper-based metallization systems are considered. For example, the conductive barrier material 113 may include any appropriate material composition, for instance in the form of tantalum, tantalum nitride, titanium, titanium nitride, cobalt, tungsten, phosphorous-containing alloys and the like. Consequently, the conductive barrier layer 113 may provide integrity of the metal region 112 and the dielectric material 111, for instance with respect to diffusion of copper into the dielectric material 111 and with respect to the diffusion of reactive components, such as fluorine, oxygen and the like, into the metal region 112, as is also previously explained. Furthermore, in the manufacturing stage shown, the device 100 may comprise a silicon, nitrogen and carbon-containing dielectric layer 120, which may also be referred to as a nitrogen-containing silicon carbide layer, which may have a dielectric constant of approximately 5.0 and less. Furthermore, the dielectric layer 120 may have an internal compressive stress level, as indicated by arrows 121, which may be approximately 1 GPa or higher, such as up to 1.6 GPa or higher. It should be appreciated that an internal stress level may be determined in accordance with well-established measurement techniques, for instance by evaluating mechanical effects that may be created by a reference layer on a specified substrate under predefined measurement conditions, wherein the reference layer and dielectric layer 120 may be formed on the basis of the same deposition ambient 150. In other cases, the internal stress level 121 may be determined on the basis of device-internal test structures, for instance by determining the influence of a stress to an underlying or overlying material, for instance in the form of a change in conductivity, optical behavior and the like.

The microstructure device 100 as shown in FIG. 1a may be formed according to the following processes. As previously explained, the substrate 101 may include circuit elements, if complex integrated circuits are considered, which may be formed in accordance with any appropriate manufacturing technique. Thereafter, according to well-established inlaid or damascene strategies, the dielectric material 111 may be deposited by means of any appropriate deposition technique, such as spin-on techniques, CVD and the like. It should be appreciated that the material 111 may be comprised of several different materials, if required by the overall process strategy. Thereafter, the material layer 111 may be patterned, for instance, by lithography and etch techniques, followed by the deposition of the layer 113, for instance in the form of tantalum, tantalum nitride and the like, which may be accomplished by sputter deposition, CVD, self-limiting deposition techniques, such as atomic layer deposition (ALD), electrochemical deposition and the like. Thereafter, the metal of the region 112 may be filled in, for instance, by electrochemical deposition techniques, after which any excess material may be removed by any planarization techniques, such as chemical mechanical polishing (CMP), electro CMP, electrochemical etching and the like. Next, the deposition ambient 150 may be established by first creating an appropriate gaseous ambient, which may be accomplished by supplying helium, ammonia and a silicon and carbon-containing precursor gas into the gaseous ambient. In one illustrative embodiment, the silicon and carbon-containing precursor gas may be provided in the form of trimethyl silane (TMS), while in other cases other gases such as dimethyl silane, tetramethyl silane and the like may be used. Furthermore, the temperature of the device 100, i.e., at least the temperature of the layers 110, may be adjusted to a range of approximately 400-440° C., for instance approximately 420° C., which may be compatible with typical materials and process steps of the microstructure device 100 in the manufacturing stage as shown in FIG. 1a. That is, a temperature in the above-specified range may allow the deposition of the layer 120 with high internal compressive stress, without unduly affecting any materials in the layer 110 and the substrate 101. Furthermore, a pressure of the deposition ambient 150 may be adjusted to a value of approximately 1.8 Torr or less. For instance, in some illustrative embodiments, the pressure may be adjusted to approximately 1.4-1.6 Torr. When establishing the gaseous ambient for the deposition atmosphere 150, the ratio of the various precursor gases and helium may be adjusted in the following manner. For example, in some illustrative embodiments, a ratio of helium to the silicon and carbon-containing precursor gas is set to approximately 0.08-0.12. Furthermore, the ratio of helium to ammonia may be selected to be approximately 2.2-2.6, while the absolute amount of helium in the gaseous ambient of the deposition atmosphere 150 may have to be selected on the basis of the volume of a corresponding process chamber, as will be discussed later on in more detail. The above-specified ratios for the carrier and precursor gases may be used in combination with process recipes in which the deposition atmosphere 150 may be established on the basis of a plasma generated by supplying AC power using a single frequency, which may be in the range of 10-15 MHz, thereby including a standard industrially used frequency for operating plasma-based devices.

In other illustrative embodiments, the plasma in the deposition atmosphere 150 may be established on the basis of a mixed frequency power, for instance using high frequency power in the above-specified range and a low frequency power component, which are concurrently supplied to the deposition atmosphere 150. In this case, the ratio of helium to the silicon and carbon-containing precursor gas may be set to approximately 0.14-0.18, while a ratio of helium to ammonia may be selected at 1.2-1.7.

A power density within the deposition atmosphere 150 may be set to approximately 0.9-1.1 W/cm$^2$ for the process recipe based on a single frequency operation. In the mixed frequency process recipe, the total power density of both frequency components may be set to approximately 1.2 W/cm$^2$ or higher. In this case, the power density of the low frequency component may be six to eight times the power density of the high frequency component.

Under these conditions, the nitrogen-containing silicon carbide material may be deposited with a deposition rate of several hundred angstrom per minute, thereby increasingly forming the layer 120 having the above-specified internal stress level. For example, when using the dielectric layer 120 in the metallization system of a sophisticated integrated circuit, the thickness may be selected to be approximately 20 nm and less so as to maintain the overall permittivity at a low level. Consequently, a moderately high compressive strain component may be induced in the layers 110, wherein the resulting strain component may be adjusted on the basis of the thickness of the layer 120 and the actual stress level, which may range from approximately 1-1.6 GPa and higher.

In other illustrative embodiments, the dielectric material 120 may be used within the device level or a contact level of sophisticated integrated circuits so as to be in close proximity to respective channel regions of transistor structures, thereby enabling efficient strain-inducing mechanisms, as will be described later on in more detail.

FIG. 1b schematically illustrates a deposition tool 170, which may be appropriate for establishing the deposition ambient 150. The deposition tool 170 may comprise a process chamber 171 configured to accommodate a single substrate for processing, wherein, frequently, the process chamber 171 may be dimensioned for accepting substrates of a well-defined size, such as 200 mm, 300 mm and the like. For this purpose, the process chamber 171 may include a substrate holder 172 configured to receive and hold in place a substrate, such as the substrate 101, which may be accomplished by well-established substrate handling and positioning systems, as are known in the art. Furthermore, the tool 170 may comprise a gas inlet 173, which is in fluid connection to a manifold 174, which may also be configured to supply the corresponding gases in a substantially uniform manner above the substrate holder 172. For example, the manifold 174 may frequently be referred to as a shower head, for which many well-established configurations are available in the art. Furthermore, an outlet 175, in combination with appropriate equipment (not shown), may be provided to establish, in combination with the inlet 173 and the shower head 174, a desired gas flow rate and thus gas concentration within the deposition atmosphere 150.

As is well known, a plasma may be established by generating a voltage between two electrodes in the presence of a gas ambient, thereby ionizing a significant fraction of the gas and also creating respective radical gas components, as may be required for the deposition of a specified material. For example, the shower head 174 and the substrate holder 172 may act as the electrodes of the tool 170, which may be connected to a high frequency power generator 176 and a low frequency power generator 177. For example, the low frequency generator 177 may provide power to the deposition ambient 150 such that a more-or-less directed motion of ions within the deposition ambient 150 towards the substrate 101 may be induced. On the other hand, the high frequency generator 176 may provide a less directional ion motion, since the average free path length of electrons within the plasma and the deposition ambient 150 may be significantly less compared to the wavelength of the frequency used, thereby substantially not contributing to a charging of the electrode 172, which may otherwise result in a high degree of directionality of the respective ions.

Furthermore, typically, a distance 178 between the electrodes 174, 172 may be adjustable, which may frequently be referred to as a lift position, thereby also affecting the deposition characteristics, for instance, with respect to ion bombardment and the like. Similarly, the distance 178 depends on the overall configuration of the process chamber 171 and may thus have to be adapted according to the specifics of the deposition tool under consideration.

As previously indicated, the absolute amount of gas flow rates may depend on the volume of the process chamber 171, i.e., on the volume that may have to be filled by the deposition atmosphere 150. Thus, appropriate values may have to be adapted to the specific process chamber 171. In the following, process parameters for two different process recipes, i.e., a single frequency recipe and a mixed frequency recipe, will be given for a typical plasma-enhanced deposition tool "Producer" as is available from Applied Materials Inc.

According to the single frequency recipe, the following parameters may be used:
Pressure (Torr): 1.4-1.8, for example, approximately 1.5;
High frequency power (Watt): 270-330, for example, approximately 300;
Low frequency power (Watt): 0-20, for example, approximately 0;
Temperature (degree C.): 380-440, for example, approximately 420;
Lift position (mil): 320-370, for example, approximately 350;
Gas flow rates (sccm—standard cubic cm per minute):
TMS: 50-70, for example, approximately 60;
He: 550-650, for example, approximately 600;
NH$_3$: 220-280, for example, approximately 250.

The process parameters for the mixed frequency deposition recipe for the above-specified deposition tool are as follows:
Pressure (Torr): 1.2-1.8, for example, approximately 1.5;
High frequency power (Watt): 40-60, for example, approximately 50;
Low frequency power (Watt): 320-400, for example, approximately 350;
Temperature (degree C.): 380-440, for example, approximately 420;
Lift position (mil): 360-440, for example, approximately 400;
Gas flow rates (sccm—standard cubic cm per minute):
TMS: 70-90, for example, approximately 80;
He: 450-550, for example, approximately 500;

NH$_3$: 300-350, for example, approximately 325.

The above-specified values may refer to a substrate diameter of 200 mm.

FIG. 1c schematically illustrates the device 100 according to further illustrative embodiments in which a dielectric material 120 may be provided as a strain-inducing material in the contact level of the device 100 so as to be in close proximity to the channel region of a transistor device. As illustrated, the device 100 may comprise a transistor 100A at an advanced manufacturing stage. Hence, the transistor 100A may comprise drain and source regions 106, which may be formed in a semiconductor layer 102, such as a silicon-based material, which may also comprise additional components, such as germanium, tin and the like, if required for enhancing performance of the transistor 100A. A channel region 105 may be positioned between the drain and source regions 106 and may have an internal strain component 105S which may be provided in the form of a compressive stress. As previously indicated, performance of P-channel transistors may be significantly enhanced by modifying the lattice structure in the channel region 105, thereby enhancing hole mobility. Furthermore, if required, metal silicide regions 106S may be formed in the drain and source regions 106. The transistor 100A may further comprise a gate electrode structure 103 including a gate insulation layer 103A to separate the conductive portion of the gate electrode structure 103 from the channel region 105. Furthermore, depending on the overall device configuration, the gate electrode structure 103 may comprise, at least partially, a metal-containing conductive material, for instance in the form of a metal silicide region 103S. It should be appreciated, however, that the gate electrode structure 103 may comprise any appropriate electrode material, for instance in the form of a metal, a semiconductor material and the like, depending on the overall strategy, wherein, also, appropriate dielectric materials for the layer 103A may be provided, for instance, in the form of high-k dielectric materials, silicon dioxide based materials and the like. Furthermore, in some illustrative embodiments, a spacer structure 104 may be provided on sidewalls of the gate electrode structure 103, wherein the spacer structure 104 may be comprised of silicon nitride, silicon dioxide and the like. In the manufacturing stage shown, the dielectric layer 120 may be formed above the transistor 100A, possibly in combination with an etch stop material, such as silicon dioxide (not shown), if required for the further processing of the device 100. As previously indicated, the layer 120 may induce the strain 105S or may at least contribute to the strain 105S, if additional strain-inducing mechanisms are provided in the device 100.

The device 100 comprising the transistor 100A may be formed in accordance with well-established process strategies prior to depositing the layer 120. Thereafter, the device 100 may be exposed to the deposition ambient 150, as previously explained, in order to form the layer 120, wherein the internal stress level and the thickness 120T thereof may be adjusted in accordance with overall device requirements. For example, an internal stress level of 1 GPa or higher, for example, approximately 1.4-1.6 GPa, may be provided on the basis of the above-specified deposition recipes, while the thickness 120T may be adjusted to approximately 40-100 nm, depending on the overall requirements.

Figure 1D:
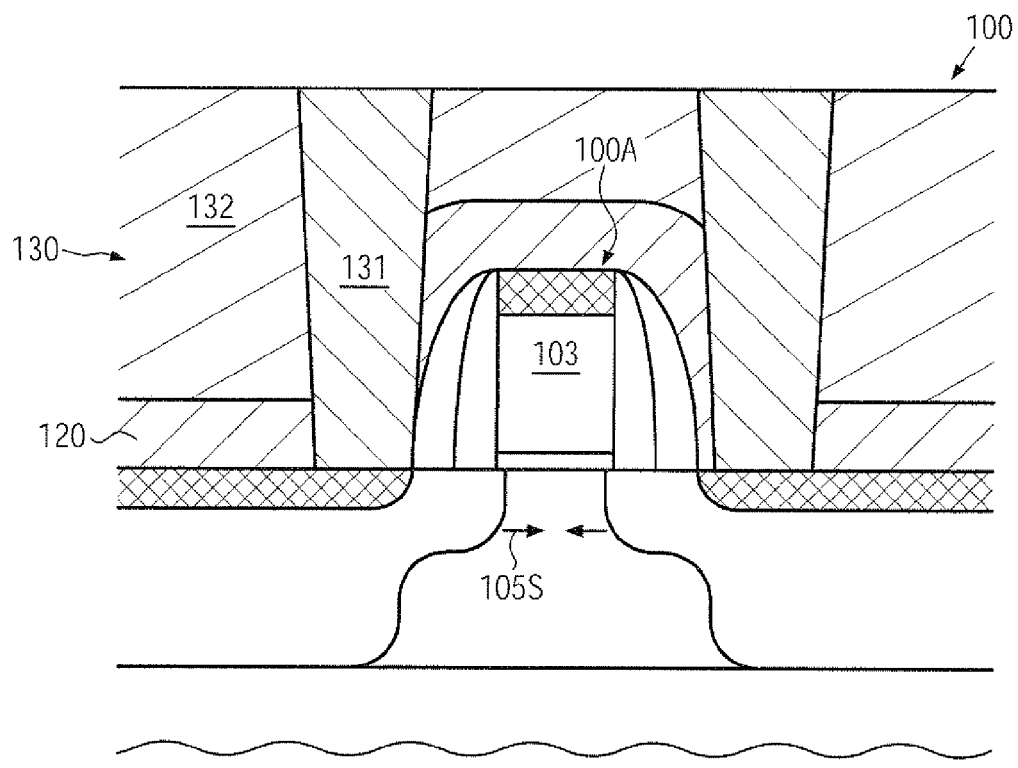

FIG. 1d schematically illustrates the device 100 in a further advanced manufacturing stage. As shown, the device 100 may comprise a contact level 130, which may include the layer 120 and an interlayer dielectric material 132, for instance in the form of silicon dioxide and the like, in which respective contact elements 131 may be formed so as to connect to the drain and source regions 106. The contact elements 131 may be filled with any appropriate conductive material, such as tungsten, aluminum, copper, if compatible with the overall device configuration, and the like, possibly in combination with appropriate barrier materials (not shown). The device level 130 may be completed by depositing the interlayer dielectric material 132 on the basis of well-established deposition techniques, such as plasma-assisted CVD, sub-atmospheric CVD and the like, possibly followed by planarization processes in order to enhance overall surface topography prior to performing a lithography sequence, after which contact openings may be etched into the interlayer dielectric material 132. During this etch process, in some illustrative embodiments, the dielectric layer 120 may act as an etch stop material due to its superior diffusion and etch stop capabilities, as previously explained. Thereafter, a further etch process may be performed so as to etch through the layer 120 on the basis of an appropriate etch chemistry, for which well-established recipes are available. Thereafter, the corresponding contact openings may be filled with a metal-containing material, thereby forming the contact elements 131.

As a consequence, the dielectric material of reduced permittivity may provide enhanced electrical performance of the contact level with respect to signal propagation delay, while nevertheless enabling a high degree of compatibility with conventional manufacturing strategies, in which, typically, stressed silicon nitride material may be used.

Figure 1E:
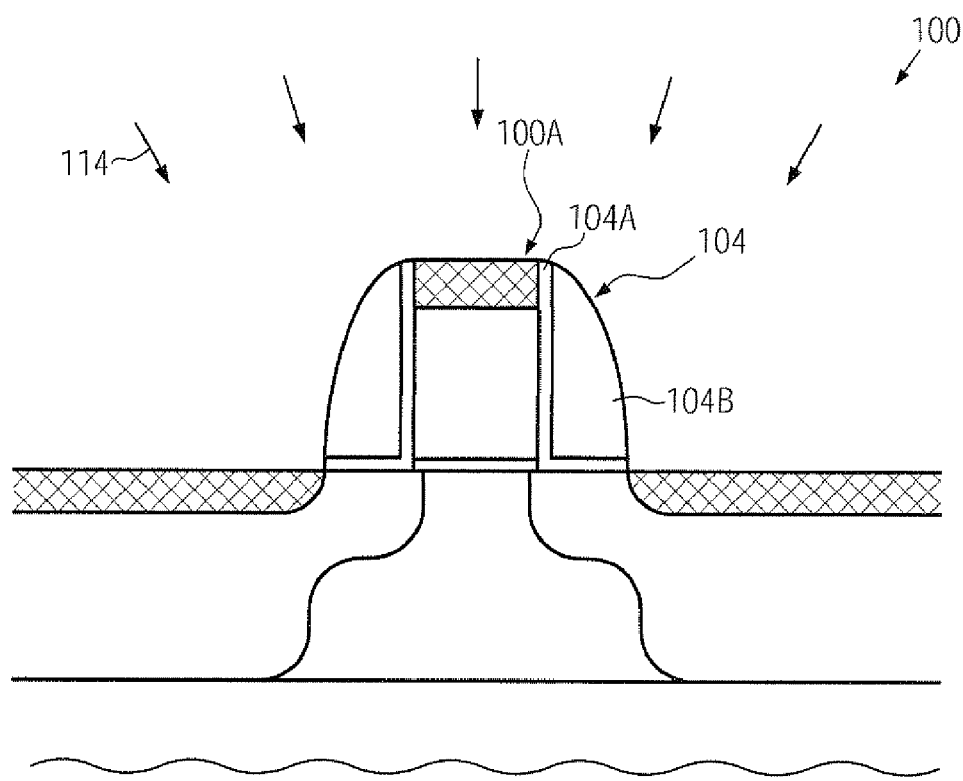
Figure 1F:
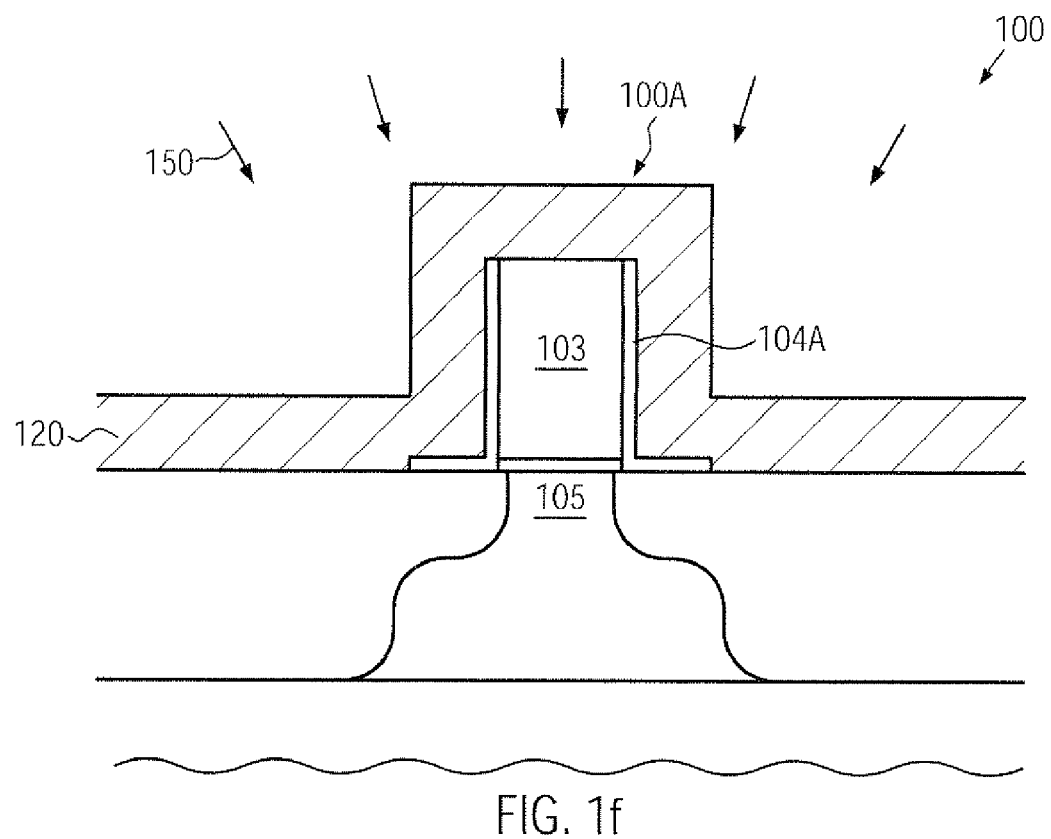

FIGS. 1e-1f schematically illustrate further illustrative embodiments in which the dielectric layer 120 may be positioned more closely to the channel region.

FIG. 1e schematically illustrates the device 100 in which the transistor 100A may be substantially completed, wherein, however, prior to the deposition of the dielectric material 120, at least a portion of the spacer structure 104 may be removed on the basis of an etch process 114. For example, the spacer structure 104 may comprise an etch stop liner 104A in combination with at least one spacer element 104B, which may be efficiently removed during the process 114.

FIG. 1f schematically illustrates the device 100 when exposed to the deposition ambient 150 to form the dielectric layer 120, which may now be positioned more closely to the channel region 105, while also replacing the spacer element 104, which may, in some cases, be advantageous with respect to the overall electrical performance in view of signal propagation delay. Consequently, enhanced strain may be achieved for a given thickness and internal stress level of the dielectric material 120, while at the same time a reduced overall permittivity may be provided in the vicinity of the gate electrode 103.

Figure 1G:
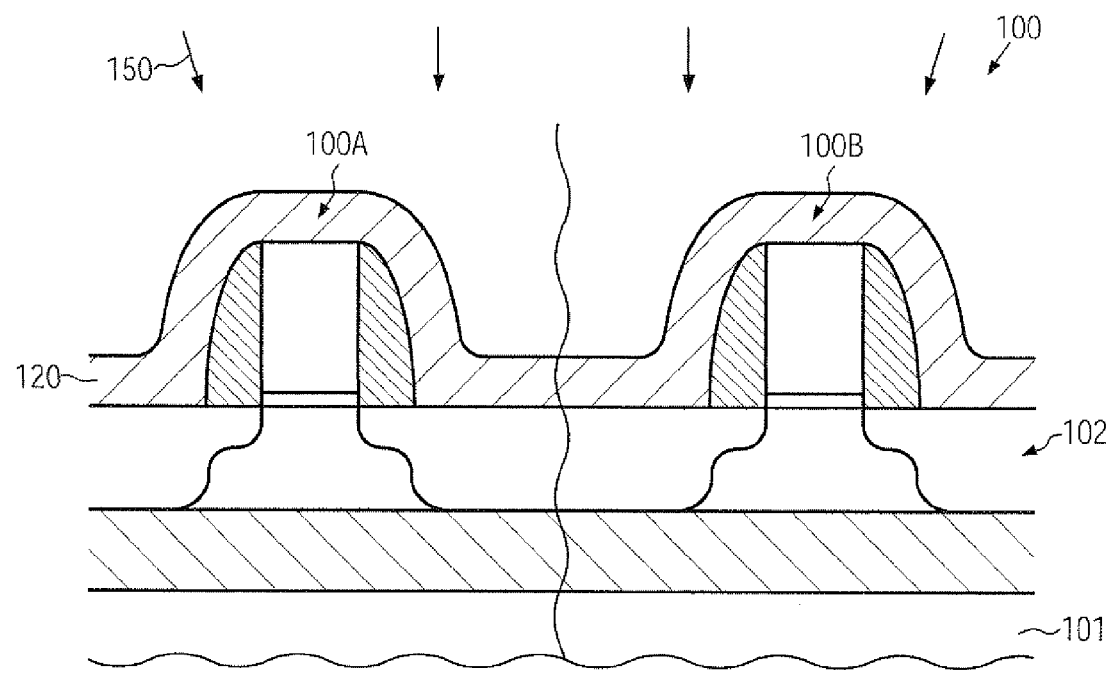
FIGS. 1g-1h schematically illustrate cross-sectional views of a semiconductor device during various manufacturing stages in providing a nitrogen-containing silicon carbide layer in the contact level for different transistor types, according to still further illustrative embodiments.
Figure 1H:
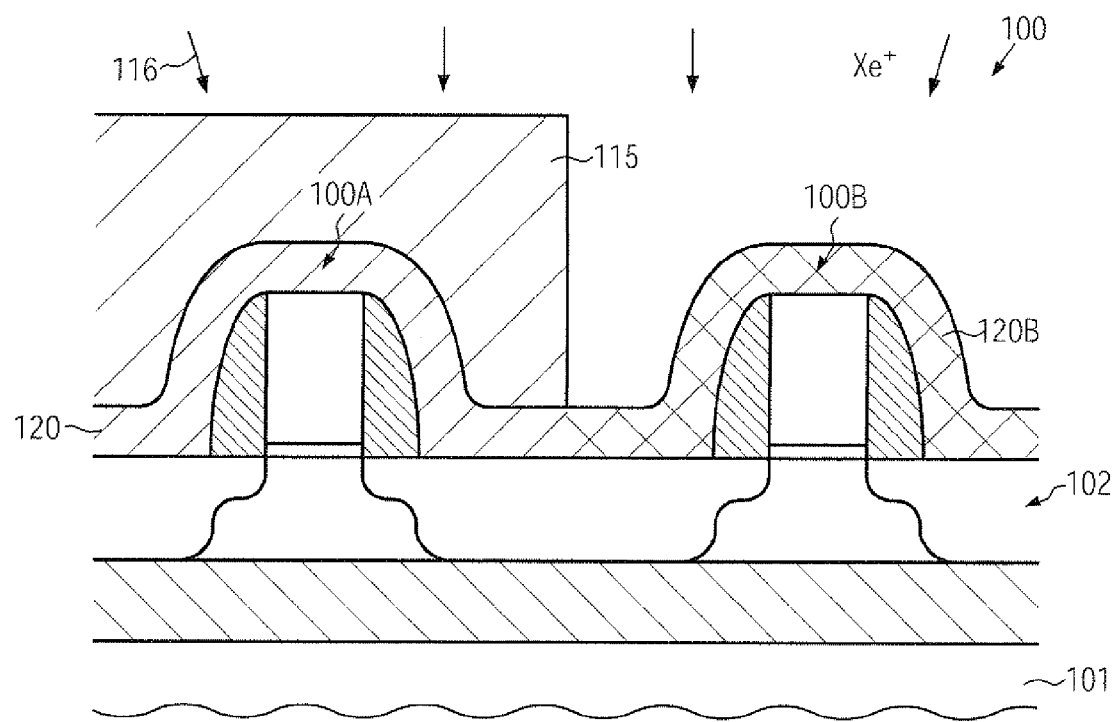

With reference to FIGS. 1g-1h, further illustrative embodiments will now be described, in which the dielectric layer 120 may be provided above different transistors, which may require different strain levels in the corresponding channel regions.

FIG. 1g schematically illustrates the device 100 comprising the transistor 100A and a second transistor 100B. The transistor 100A may have a configuration as previously explained. The transistor 100B may differ from the transistor 100A in that a different strain level may have to be provided in its channel region. For example, the transistor 100B may represent an N-channel transistor in which compressive strain may adversely affect overall transistor performance. In other cases, the transistor 100B may be of the same conductivity type as the transistor 100A, while, however, a reduced strain level may be desired. Furthermore, the device 100 may be exposed to the deposition ambient 150 so as to form the dielectric layer 120 with the internal compressive stress level above the first and second transistors 100A, 100B with a desired thickness. With respect to the layer thickness and the internal stress level, the same criteria apply as previously explained.

FIG. 1*h* schematically illustrates the device 100 in an advanced manufacturing stage in which an implantation mask 115 may be provided to protect the first transistor 100A during an ion implantation process 116, while exposing the portion of the layer 120 located above the second transistor 100B. The ion implantation process 116 may be performed on the basis of any appropriate species, such as xenon and the like, which may be appropriate for modifying the molecular structure of the exposed portion of the layer 120, thereby significantly relaxing the internal stress level and thus creating a relaxed portion 120B above the second transistor 100B. Thereafter, the further processing may be continued by depositing an appropriate interlayer dielectric material, such as the material 132 (FIG. 1*d*) and forming respective contact elements. In other illustrative embodiments (not shown), the portion of the dielectric material 120 above the second transistor 100B may be removed and may be replaced by a material including a tensile stress component, for instance in the form of silicon nitride material, which may be deposited on the basis of well-established recipes. A respective strategy may be applied if performance gain of the transistor 100B in view of the additional tensile strain may be higher compared to the performance loss caused by the provision of a dielectric material of increased dielectric constant. However, in any case, performance of the first transistor 100A may be increased due to the provision of a high compressive stress in the layer 120 in addition to a reduced permittivity.

Figure 1I:
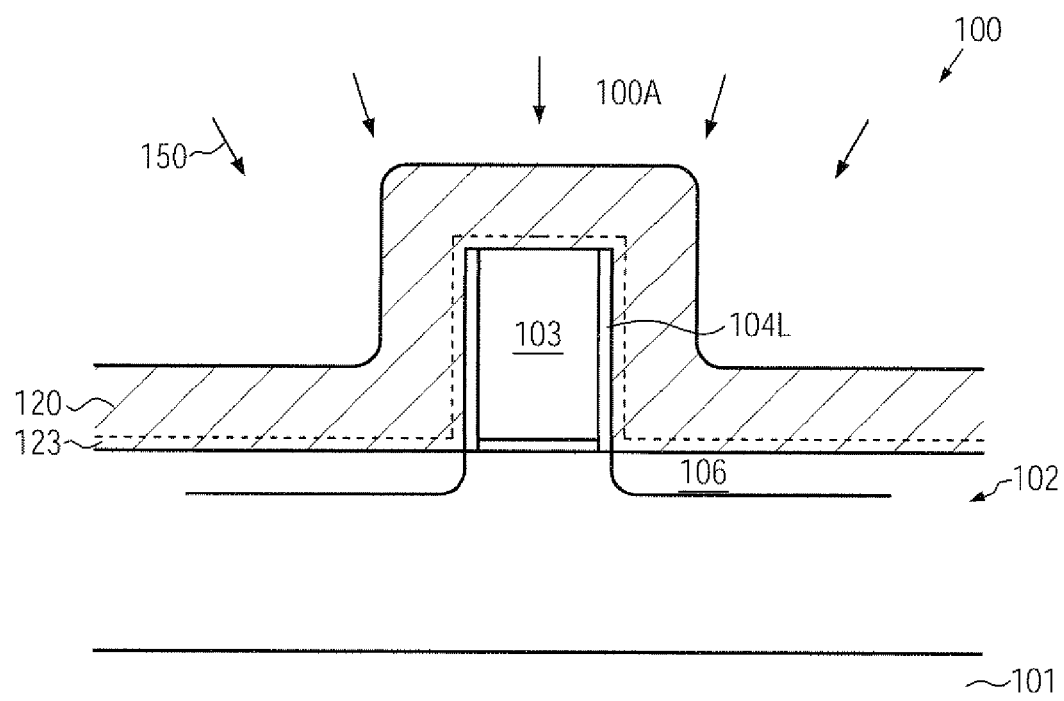
FIGS. 1i-1j schematically illustrate cross-sectional views of a transistor structure during various manufacturing stages in which a low-k highly stressed spacer element may be formed on the basis of a nitrogen-containing silicon carbide layer, according to still other illustrative embodiments.
Figure 1J:
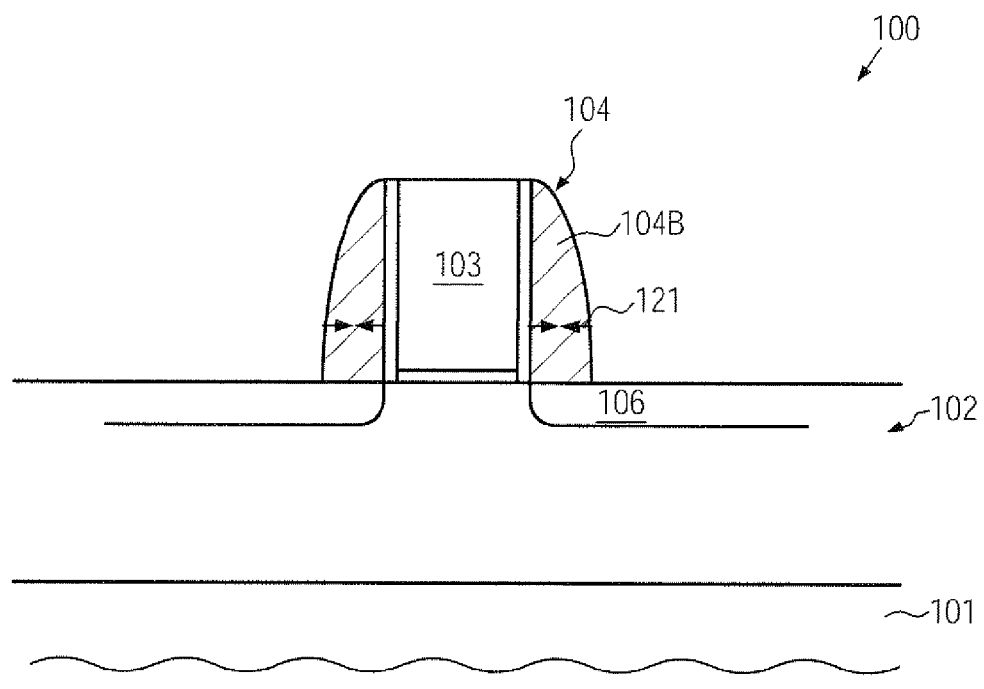

With reference to FIGS. 1*i*-1*j*, further illustrative embodiments will now be described, in which the dielectric material 120 may be used as a spacer layer in which spacer elements may be formed, when a reduced permittivity of spacer elements is considered advantageous for enhanced performance of respective circuit elements.

FIG. 1*i* schematically illustrates the device 100 in a manufacturing stage in which gate electrode structures and respective lines may have been formed above the semiconductor layer 102. For example, the gate electrode structure 103, which may represent an actual gate electrode structure of a transistor to be formed or which may represent a conductive line in the device level of the device 100, may be formed in accordance with process techniques as previously described. Moreover, depending on the overall process strategy, based on offset spacer elements 104L, a dopant profile may have been established, for instance as a part of the drain and source regions 106, as previously described. Thereafter, the device may be exposed to the deposition ambient 150 to form the dielectric layer 120, wherein, in some illustrative embodiments, an etch stop layer 123, for instance comprised of silicon dioxide, may be formed, for instance, by plasma-assisted deposition techniques and the like. It should be appreciated that the dielectric material 120 may be provided with a desired internal stress level while a thickness thereof may be selected so as to correspond to a width of spacer elements to be formed from the layer 120. For this purpose, an anisotropic etch process may be performed on the basis of well-established etch chemistries to remove material of the layer 120, while controlling the etch process on the basis of the stop layer 123, if provided, or on the basis of a selectivity with respect to material of the semiconductor layer 102 and the gate electrode structure 103, depending on the overall process strategy.

FIG. 1*j* schematically illustrates the device 100 after completing the above-described process sequence. Hence, a spacer structure 104 may be provided in which the spacer element 104B is comprised of the remains of the layer 120, thereby providing the stress component 121, which may, to a certain degree, be transferred into the neighboring gate electrode structure 103 and also into the layer 102, as previously explained. Additionally, the spacer 104B may provide a reduced dielectric constant compared to conventionally used silicon nitride spacers.

As a result, the present disclosure provides semiconductor devices and methods in which a dielectric material of high etch stop and barrier capabilities may be provided with a moderately low dielectric constant of approximately 5.0 or less, while also providing a high internal compressive stress level of approximately 1 GPa and higher. For this purpose, a plasma-assisted deposition ambient may be established, for instance, on the basis of a single frequency recipe or a mixed frequency recipe, in which process parameters, such as pressure, power density, gas flow ratios and the like may be appropriately adjusted. Consequently, in some illustrative embodiments, the corresponding dielectric material may be efficiently used in the contact level so as to allow efficient strain engineering techniques while not unduly contributing to signal propagation delay.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
providing a substrate having formed thereon one or more material layers for defining one or more features of a microstructure device;
establishing a gas ambient comprising helium (He), ammonia ($NH_3$) and a silicon and carbon-containing precursor gas at a pressure of approximately 1.8 Torr or less;
creating a plasma in said gas ambient by supplying AC power at a power density of approximately 0.9 W/cm$^2$ to approximately 1.5 W/cm$^2$; and
forming a dielectric nitrogen-containing silicon carbide layer above said one or more material layers in the presence of said plasma, said dielectric nitrogen-containing silicon carbide layer having an internal stress level of approximately 1 GPa or higher and a dielectric constant of approximately 5 or less.

2. The method of claim 1, wherein said dielectric nitrogen-containing silicon carbide layer has an internal compressive stress level of approximately 1.2 GPa or higher.

3. The method of claim 1, wherein creating said plasma comprises supplying said AC power with a frequency of approximately 10 MHz or higher.

4. The method of claim 3, wherein said AC power is supplied with a power density of approximately 0.9 W/cm$^2$ to 1.1 W/cm$^2$.

5. The method of claim 1, wherein creating said plasma comprises supplying said AC power as a first AC component with a first frequency of approximately 10 MHz or higher and as a second AC component with a second frequency of approximately 5 MHz or less.

6. The method of claim 5, wherein said second AC component is supplied at a higher power density relative to said first AC component.

7. The method of claim 6, wherein a combined power density of said first and second AC components is approximately 1.2 W/cm² or higher.

8. The method of claim 4, wherein a ratio of helium to said silicon and carbon-containing precursor gas is approximately 0.08 to 0.12.

9. The method of claim 5, wherein a ratio of helium to said silicon and carbon-containing precursor gas is approximately 0.14 to 0.18.

10. The method of claim 1, wherein said silicon and carbon-containing precursor gas is trimethyl silane.

11. The method of claim 8, wherein a ratio of helium to ammonia is approximately 2.2 to 2.6.

12. The method of claim 9, wherein a ratio of helium to ammonia is approximately 1.2 to 1.7.

13. The method of claim 1, wherein said dielectric nitrogen-containing silicon carbide layer is formed above a transistor of said microstructure device and wherein said method further comprises forming an interlayer dielectric material on said dielectric layer and patterning said interlayer dielectric material using said dielectric nitrogen-containing silicon carbide layer as an etch stop.

14. The method of claim 1, wherein said dielectric nitrogen-containing silicon carbide layer is formed above a gate electrode structure of said microstructure and wherein said method further comprises performing an etch process so as to form a sidewall spacer element on sidewalls of said gate electrode structure.

15. A method, comprising:
   forming a dielectric nitrogen-containing silicon carbide layer above a transistor structure, said dielectric nitrogen-containing silicon carbide layer having an internal stress level of approximately 1 GPa or higher of compressive stress; and
   forming a contact opening in said dielectric nitrogen-containing silicon carbide layer so as to connect to at least one of a drain region and a source region of said transistor structure.

16. The method of claim 15, further comprising forming said nitrogen-containing silicon carbide dielectric layer above a second transistor structure and selectively reducing said internal stress level of a portion of said dielectric nitrogen-containing silicon carbide layer located above said second transistor structure.

17. The method of claim 15, wherein said dielectric nitrogen-containing silicon carbide layer is formed by establishing a plasma ambient comprising helium (He), ammonia ($NH_3$) and trimethyl silane at a pressure of approximately 1.8 Torr or less.

* * * * *